United States Patent
Chiu et al.

(10) Patent No.: US 10,804,365 B2
(45) Date of Patent: Oct. 13, 2020

(54) SEMICONDUCTOR DEVICE AND METHOD FOR FABRICATING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Chun-Chieh Chiu, Keelung (TW); Pin-Hong Chen, Tainan (TW); Yi-Wei Chen, Taichung (TW); Tsun-Min Cheng, Changhua County (TW); Chih-Chien Liu, Tainan (TW); Tzu-Chieh Chen, Pingtung County (TW); Chih-Chieh Tsai, Kaohsiung (TW); Kai-Jiun Chang, Taoyuan (TW); Yi-An Huang, New Taipei (TW); Chia-Chen Wu, Nantou County (TW); Tzu-Hao Liu, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

(*) Notice: Subject to any disclaimer, the term of this patent is extended or adjusted under 35 U.S.C. 154(b) by 0 days.

(21) Appl. No.: 15/985,730

(22) Filed: May 22, 2018

(65) Prior Publication Data
US 2019/0319107 A1 Oct. 17, 2019

(30) Foreign Application Priority Data
Apr. 16, 2018 (CN) .......................... 2018 1 0337007

(51) Int. Cl.
*H01L 21/02* (2006.01)
*H01L 29/49* (2006.01)
(Continued)

(52) U.S. Cl.
CPC .... *H01L 29/4941* (2013.01); *H01L 21/02532* (2013.01); *H01L 21/02592* (2013.01);
(Continued)

(58) Field of Classification Search
CPC ......... H01L 21/02592; H01L 27/10873; H01L 29/4941
See application file for complete search history.

(56) References Cited

U.S. PATENT DOCUMENTS

| 8,558,299 B2 | 10/2013 | Cao et al. |
| 9,583,349 B2 | 2/2017 | Gandikota et al. |

(Continued)

FOREIGN PATENT DOCUMENTS

| CN | 101060121 A | 10/2007 |
| CN | 105990239 A | 10/2016 |

*Primary Examiner* — Kenneth Parker
*Assistant Examiner* — Long H Le
(74) *Attorney, Agent, or Firm* — Winston Hsu

(57) ABSTRACT

A method for fabricating semiconductor device includes the steps of first forming a silicon layer on a substrate and then forming a metal silicon nitride layer on the silicon layer, in which the metal silicon nitride layer includes a bottom portion, a middle portion, and a top portion and a concentration of silicon in the top portion is greater than a concentration of silicon in the middle portion. Next, a conductive layer is formed on the metal silicon nitride layer and the conductive layer, the metal silicon nitride layer, and the silicon layer are patterned to form a gate structure.

10 Claims, 3 Drawing Sheets

(51) Int. Cl.
*H01L 27/108* (2006.01)
*H01L 21/3213* (2006.01)
*H01L 21/28* (2006.01)
*H01L 29/423* (2006.01)
*H01L 21/285* (2006.01)

(52) U.S. Cl.
CPC .. *H01L 21/28052* (2013.01); *H01L 21/28061* (2013.01); *H01L 21/32133* (2013.01); *H01L 27/10873* (2013.01); *H01L 27/10885* (2013.01); *H01L 29/42372* (2013.01); *H01L 21/28518* (2013.01); *H01L 21/28556* (2013.01); *H01L 27/10805* (2013.01)

(56) References Cited

U.S. PATENT DOCUMENTS

| | | | |
|---|---|---|---|
| 2002/0094652 A1* | 7/2002 | Akram | H01L 29/4941 438/301 |
| 2004/0211999 A1* | 10/2004 | Yamamoto | H01L 21/28044 257/296 |
| 2006/0194451 A1* | 8/2006 | Lee | H01L 29/518 438/786 |
| 2019/0035851 A1* | 1/2019 | Tortorelli | H01L 27/2463 |

* cited by examiner

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method for fabricating bit line structure of a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating semiconductor device includes the steps of first forming a silicon layer on a substrate and then forming a metal silicon nitride layer on the silicon layer, in which the metal silicon nitride layer includes a bottom portion, a middle portion, and a top portion and a concentration of silicon in the top portion is greater than a concentration of silicon in the middle portion. Next, a conductive layer is formed on the metal silicon nitride layer and the conductive layer, the metal silicon nitride layer, and the silicon layer are patterned to form a gate structure.

According to another aspect of the present invention, a semiconductor device includes a gate structure on a substrate, in which the gate structure includes a silicon layer on the substrate, a metal silicon nitride layer on the silicon layer, and a conductive layer on the metal silicon nitride layer. Preferably, the metal silicon nitride layer includes a bottom portion, a middle portion, and a top portion and a concentration of silicon in the top portion is greater than a concentration of silicon in the middle portion.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
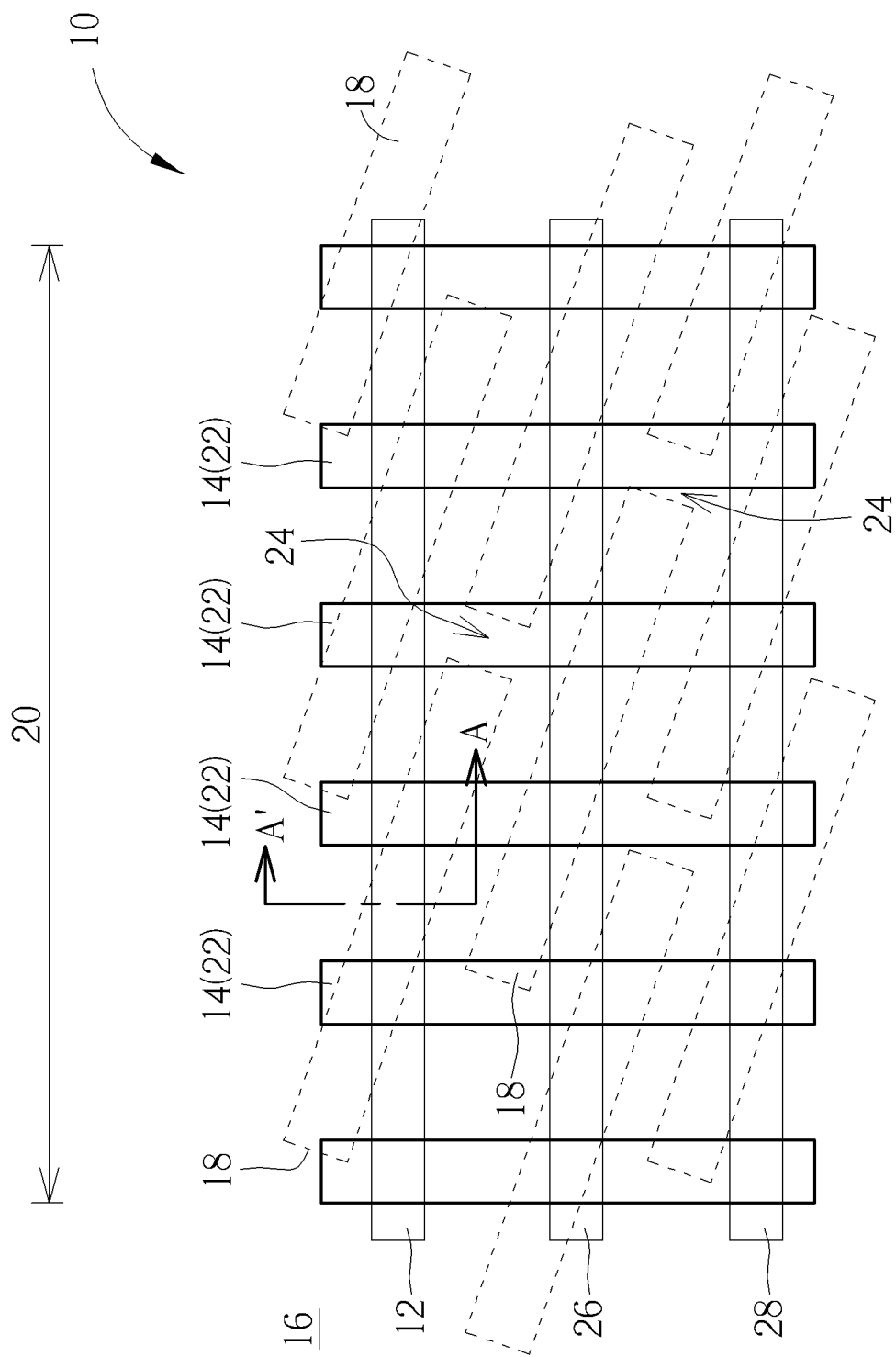
FIG. 1 illustrates a top-view diagram for fabricating a DRAM device according to an embodiment of the present invention.
Figure 2:
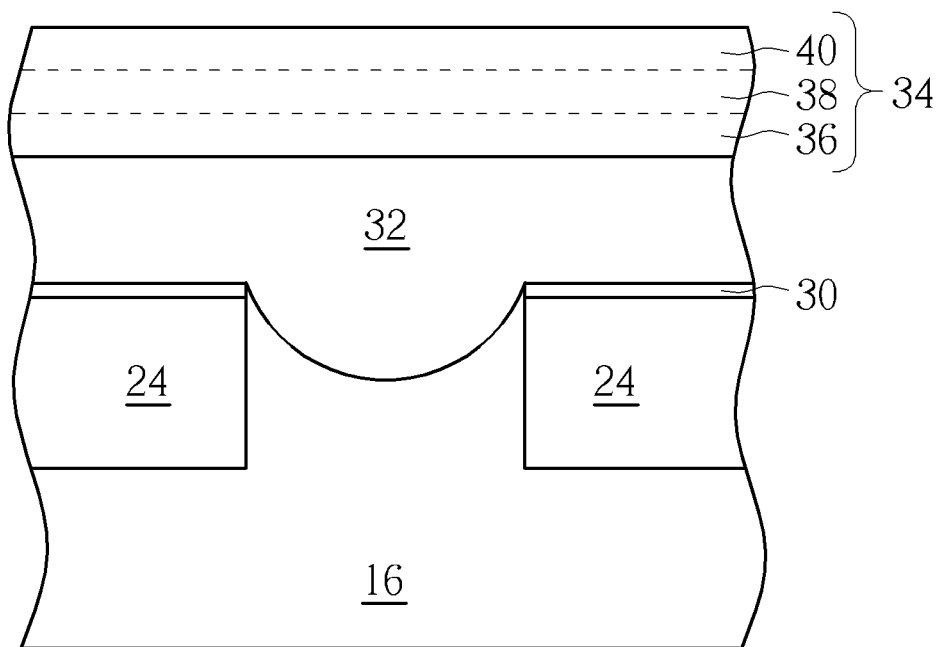
FIGS. 2-4 illustrate cross-sectional views of a method for fabricating bit line of the DRAM device along the sectional line AA' of FIG. 1.
Figure 3:
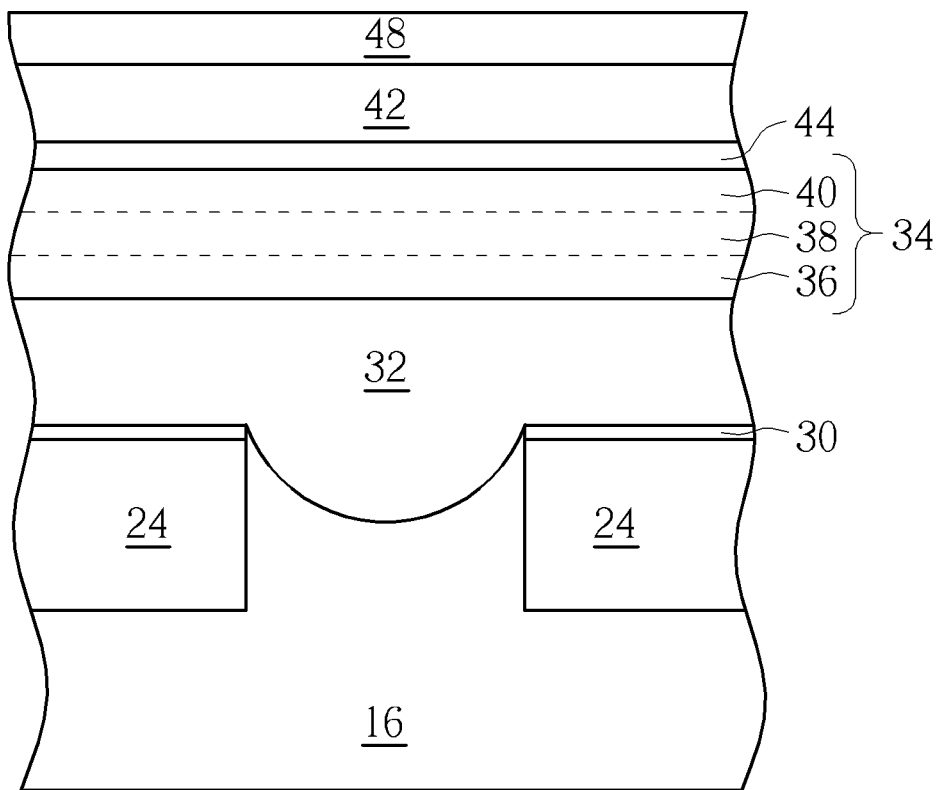
Figure 4:
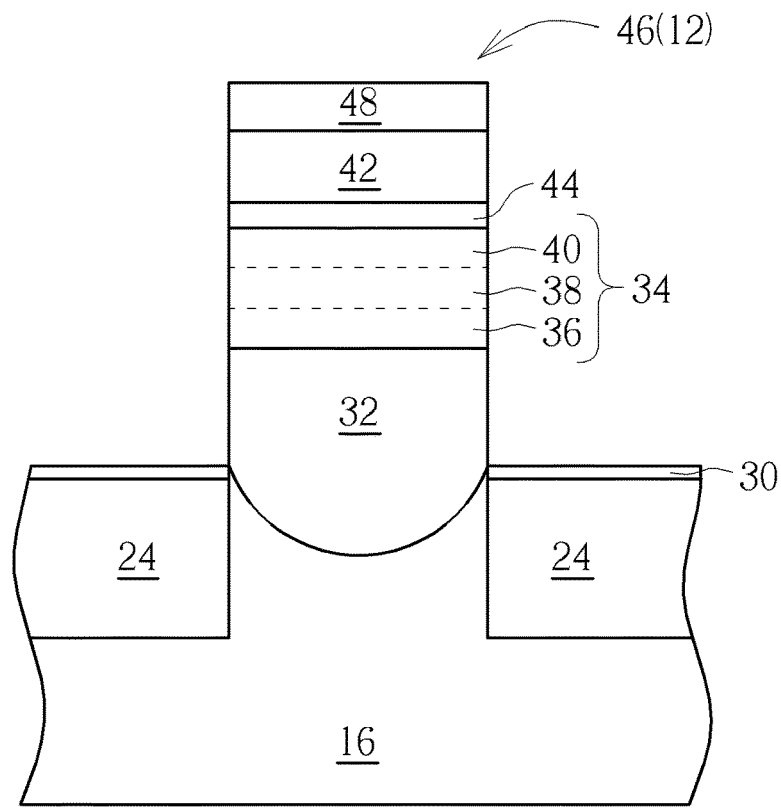

Referring to FIGS. 1-4, FIGS. 1-4 illustrate a method for fabricating a DRAM device according to an embodiment of the present invention, in which FIG. 1 illustrates a top-view diagram for fabricating a DRAM device and FIGS. 2-4 illustrate cross-sectional views of a method for fabricating bit line of the DRAM device along the sectional line AA' of FIG. 1. Preferably, the present embodiment pertains to fabricate a memory device, and more particularly a DRAM device 10, in which the DRAM device 10 includes at least a transistor device (not shown) and at least a capacitor structure (not shown) that will be serving as a smallest constituent unit within the DRAM array and also used to receive electrical signals from bit lines or bit line structures 12, 26, 28 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region (not shown) are also defined on the substrate 16, in which multiple word lines 14 and multiple bit line structures 12, 26, 28 are preferably formed on the memory region 20 while other active devices (not shown) could be formed on the periphery region. For simplicity purpose, only devices or elements on the memory region 20 are shown in FIG. 1 while elements on the periphery region are omitted.

In this embodiment, the active regions 18 are disposed parallel to each other and extending along a first direction, the word lines 14 or multiple gates 22 are disposed within the substrate 16 and passing through the active regions 18 and STI 24. Specifically, the gates 22 are disposed extending along a second direction such as Y-direction, in which the second direction crosses the first direction at an angle less than 90 degrees.

The bit line structures 12, 26, 28 are disposed on the substrate 16 parallel to each other and extending along a third direction such as X-direction while crossing the active regions 18 and STI 24, in which the third direction is different from the first direction and orthogonal to the second direction. In other words, the first direction, second direction, and third direction are all different from each other while the first direction is not orthogonal to both the second direction and the third direction. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

The fabrication process conducted after the formation of word lines 14 (or also referred to as buried word lines) and STI 24 is explained below. First as shown in FIG. 2, a STI 24 is formed in the substrate 16 to define the active regions 18 and word lines (not shown) are formed in part of the STI 24 and the substrate 16, and an insulating layer or more specifically a gate insulating layer 30 is formed on the surface of the STI 24 and the substrate 16. Preferably, the gate insulating layer 30 is serving as a gate insulating layer on the periphery region while serving as a mask layer on the memory region 20 in this embodiment. Next, a photo-etching process is conducted by using patterned mask (not shown) as mask to remove part of the gate insulating layer 30 between the STI 24 and part of the substrate 16 to form a recess (not shown) and then form a semiconductor layer or more specifically a silicon layer 32 in the recess and on the surface of the gate insulating layer 30, in which part of the silicon layer 32 directly contacting the substrate 16 preferably serves as a bit line contact (BLC) after a patterning process conducted afterwards. Next, a pre-clean process could be selectively conducted to remove impurities on the silicon layer 32, and an atomic layer deposition (ALD) process is conducted to form a first metal silicon nitride layer 34 on the surface of the silicon layer 32.

In this embodiment, the gate insulating layer 30 is preferably a single-layered structure made of silicon oxide. Nevertheless, according to an embodiment of the present invention, the gate insulating layer 30 could also be a multi-layered structure made of a silicon oxide layer, a silicon nitride, layer, and another silicon oxide layer, which is also within the scope of the present invention. Next, the silicon layer 32 disposed on the gate insulating layer 30 preferably includes amorphous silicon and the metal silicon nitride layer 34 preferably includes titanium silicon nitride (TiSiN), but not limited thereto. For instance, the metal within the metal silicon nitride layer 34 could also be selected from the group consisting of titanium, tungsten, nickel, and cobalt, which are all within the scope of the present invention.

It should be noted that during the formation of the metal silicon nitride layer 34, flow rates or volume of the reacting gases such as titanium tetrachloride ($TiCl_4$), dichlorosilane (DCS), and ammonia ($NH_3$) used for forming the metal silicon nitride layer 34 are adjusted so that the metal silicon nitride layer 34 preferably includes three portions, including a bottom portion 36, a middle portion 38, and a top portion 40 and the concentrations of silicon in the three portions 36, 38, 40 are all different. Specifically, the flow of DCS is adjusted in each stage during the formation of the metal silicon nitride layer 34. For instance, the flow of DCS injected during the formation of the bottom portion 36 is greater than the flow of DCS injected during the formation of the middle portion 38 or top portion 40 while the flow of DCS injected during the formation of the middle portion 38 is also less than the flow of DCS injected during the formation of the top portion 40.

By using this recipe of flow adjustment, the concentration of silicon in the bottom portion 36 within the metal silicon nitride layer 34 is preferably greater than the concentration of silicon in the top portion 40 and the concentration of silicon in the top portion 40 is also greater than the concentration of silicon in the middle portion 38, in which the concentration of silicon described here refers to the ratio of concentration of silicon atom occupied in TiSiN. According to a preferred embodiment of the present invention, the concentration of silicon in the bottom portion 36 is greater than 30 atm %, the concentration of silicon in the top portion 40 is between 20 atm % to 30 atm %, and the concentration of silicon in the middle portion 38 is between 15 atm % to 20 atm %.

In this embodiment, the thickness of the bottom portion 36 is preferably equal to the thickness of the top portion 40, nevertheless there is no particular limitation regarding the thickness between the top and bottom portions and the middle portion 38. According to an embodiment of the present invention, the thickness of the bottom portion 36 or the thickness of the top portion 40 could be greater than, equal to, or less than the thickness of the middle portion 38. According to yet another alternative of the present invention, a combined or total thickness of the bottom portion 38 and the top portion 40 could also be greater than, equal to, or less than the thickness of the middle portion 38, which are all within the scope of the present invention.

Next, as shown in FIG. 3, a conductive layer 42 and a cap layer 48 could be sequentially formed on the surface of the metal silicon nitride layer 34, in which the conductive layer 42 is preferably includes tungsten and the cap layer 48 preferably includes silicon nitride. It should be noted that an optional thermal treatment process (such as an anneal process) could be conducted during the formation of the conductive layer 42 so that an additional metal silicide 44 could be formed between the metal silicon nitride layer 34 and the conductive layer 42, in which the metal silicide 44 preferably includes tungsten silicide.

Next, as shown in FIG. 4, a patterning or photo-etching process could be conducted to pattern the cap layer 48, the conductive layer 42, the metal silicide 44, the metal silicon nitride layer 34, and the silicon layer 32 to form a gate structures 46 on the substrate 16. Specifically, the gate structure 46 formed at this stage preferably serving as a bit line structure 12 for a DRAM device while part of the silicon layer 32 directly contacting the substrate 16 is serving as a bit line contact. Next, storage node contacts could be formed adjacent to two sides of the bit line structure 12 to electrically connect source/drain regions and capacitors formed in the later process. Since the fabrication of storage node contacts and capacitors is well known to those skilled in the art, the details of which are not explained herein for the sake of brevity.

Referring again to FIG. 4, FIG. 4 further illustrates a structural view of a semiconductor device according to an embodiment of the present invention. As shown in FIG. 4, the semiconductor device includes a gate structure 46 on a substrate 16, in which the gate structure 46 includes a silicon layer 32 disposed on the substrate 16, a metal silicon nitride layer 34 disposed on the silicon layer 32, a conductive layer 42 disposed on the metal silicon nitride layer 34, a metal silicide 44 disposed between the metal silicon nitride layer 34 and the conductive layer 42, and a cap layer 48 disposed on the conductive layer 42.

In this embodiment, the silicon layer 32 preferably includes amorphous silicon, the metal silicon nitride layer 34 preferably includes TiSiN, the metal silicide 44 preferably includes tungsten silicide, and the conductive layer 42 preferably includes tungsten, in which the metal silicon nitride layer 34 further includes a bottom portion 36, a middle portion 38, and a top portion 40 and the concentration of silicon in these three portions are all different. Specifically, the concentration of silicon in the bottom portion 36 is preferably greater than the concentration of silicon in the top portion 40 and the concentration of silicon in the top portion 40 is also greater than the concentration of silicon in the middle portion 38, in which the concentration of silicon described here refers to the ratio of concentration of silicon atom occupied in TiSiN. According to a preferred embodiment of the present invention, the concentration of silicon in the bottom portion 36 is greater than 30 atm % , the concentration of silicon in the top portion 40 is between 20 atm % to 30 atm %, and the concentration of silicon in the middle portion 38 is between 15 atm % to 20 atm %.

In this embodiment, the thickness of the bottom portion 36 is preferably equal to the thickness of the top portion 40, however, there is no particular limitation regarding the thickness between the top and bottom portions and the middle portion 38. According to an embodiment of the present invention, the thickness of the bottom portion 36 or the thickness of the top portion 40 could be greater than, equal to, or less than the thickness of the middle portion 38. According to yet another alternative of the present invention, a combined or total thickness of the bottom portion 38 and the top portion 40 could also be greater than, equal to, or less than the thickness of the middle portion 38, which are all within the scope of the present invention.

Figure 5:
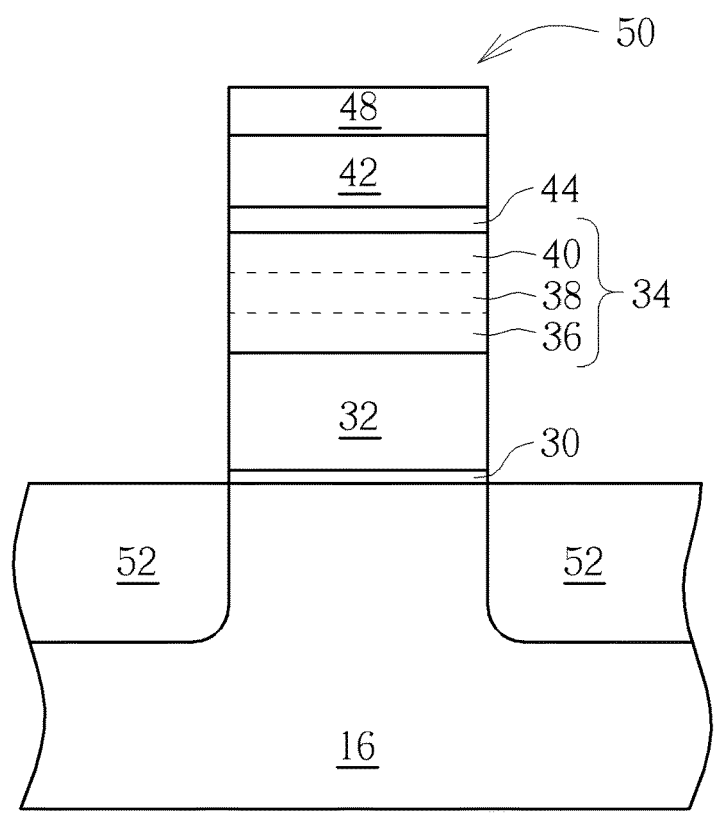
FIG. 5 illustrates a structural view of a semiconductor device on the periphery region according to an embodiment of the present invention.

Referring to FIG. 5, FIG. 5 illustrates a structural view of a semiconductor device according to an embodiment of the present invention. As shown in FIG. 5, it would also be desirable to conduct the aforementioned process to form the bit line structure 12 on the memory region 20 in FIG. 4 and at the same time form another gate structure 50 on the substrate 16 on the periphery region. Preferably, the gate structure 50 includes a silicon layer 32 disposed on the substrate 16, a gate insulating layer 30 disposed between the silicon layer 32 and the substrate 16, a metal silicon nitride layer 34 disposed on the silicon layer 32, a conductive layer 42 disposed on the metal silicon nitride layer 34, a metal silicide 44 disposed between the metal silicon nitride layer 34 and the conductive layer 42, and a cap layer 48 disposed on the conductive layer 42. In contrast to having STI 24 disposed adjacent to two sides of the gate structure 46 in FIG. 4, a source/drain region 52 is disposed in the substrate 16 adjacent to two sides of the gate structure 50 on the periphery region, in which the source/drain region 52 could include n-type or p-type dopants depending on the type of transistor to be fabricated.

Similar to the aforementioned embodiment, the gate insulating layer 30 preferably includes silicon oxide, the silicon layer 32 preferably includes amorphous silicon, the metal silicon nitride layer 34 preferably includes TiSiN, the metal silicide 44 preferably includes tungsten silicide, and the conductive layer 42 preferably includes tungsten, in which the metal silicon nitride layer 34 further includes a bottom portion 36, a middle portion 38, and a top portion 40 and the concentration of silicon in these three portions are all different. Specifically, the concentration of silicon in the bottom portion 36 is preferably greater than the concentration of silicon in the top portion 40 and the concentration of silicon in the top portion 40 is also greater than the concentration of silicon in the middle portion 38, in which the concentration of silicon described here refers to the ratio of concentration of silicon atom occupied in TiSiN. According to a preferred embodiment of the present invention, the concentration of silicon in the bottom portion 36 is greater than 30 atm %, the concentration of silicon in the top portion 40 is between 20 atm % to 30 atm %, and the concentration of silicon in the middle portion 38 is between 15 atm % to 20 atm %.

In this embodiment, the thickness of the bottom portion 36 is preferably equal to the thickness of the top portion 40, however, there is no particular limitation regarding the thickness between the top and bottom portions and the middle portion 38. According to an embodiment of the present invention, the thickness of the bottom portion 36 or the thickness of the top portion 40 could be greater than, equal to, or less than the thickness of the middle portion 38. According to yet another alternative of the present invention, a combined or total thickness of the bottom portion 38 and the top portion 40 could also be greater than, equal to, or less than the thickness of the middle portion 38, which are all within the scope of the present invention.

Overall, the present invention preferably adjusts the flow rate of the reacting gases including $TiCl_4$, DCS, and $NH_3$ during the formation of bit line structure on the memory region and/or gate structure on the periphery region so that the metal silicon nitride layer 34 formed is divided into bottom portion, middle portion, and top portion and the concentration of silicon in these three portions are all different. According to a preferred embodiment of the present invention, the concentration of silicon in the bottom portion 36 is greater than the concentration of silicon in the top portion 40 and the concentration of silicon in the top portion 40 is also greater than the concentration of silicon in the middle portion 38. By using this approach or recipe to adjust the silicon concentration in the metal silicon nitride layer, the present invention is able to improve the interfaces between the metal silicon nitride layer and adjacent layers and prevent silicon atom from diffusing into the conductive layer made of tungsten, and also lower the overall thickness of the metal silicon nitride layer thereby reducing the overall resistance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a gate structure on a substrate, wherein the gate structure comprises:
a silicon layer on the substrate;
a metal silicon nitride layer on the silicon layer, wherein the metal silicon nitride layer comprises a bottom portion, a middle portion, and a top portion and a concentration of silicon in the top portion is greater than a concentration of silicon in the middle portion while the bottom portion, the middle portion, and the top portion comprise a same material; and
a conductive layer on the metal silicon nitride layer.

2. The semiconductor device of claim 1, wherein the silicon layer comprises amorphous silicon.

3. The semiconductor device of claim 1, wherein a concentration of silicon in the bottom portion is different from a concentration of silicon in the top portion.

4. The semiconductor device of claim 3, wherein a concentration of silicon in the bottom portion is greater than a concentration of silicon in the top portion.

5. The semiconductor device of claim 1, wherein the metal silicon nitride layer comprises titanium silicon nitride (TiSiN).

6. The semiconductor device of claim 1, wherein a thickness of the bottom portion is equal to a thickness of the top portion.

7. The semiconductor device of claim 1, wherein a total thickness of the bottom portion and the top portion is greater than a thickness of the middle portion.

8. The semiconductor device of claim 1, further comprising a metal silicide disposed between the metal silicon nitride layer and the conductive layer.

9. The semiconductor device of claim 8, wherein the metal silicide comprises tungsten silicide.

10. The semiconductor device of claim 1, wherein the gate structure comprises a gate insulating layer on the substrate.

* * * * *